United States Patent
Reboh et al.

(10) Patent No.: US 10,347,721 B2
(45) Date of Patent: Jul. 9, 2019

(54) METHOD TO INCREASE STRAIN IN A SEMICONDUCTOR REGION FOR FORMING A CHANNEL OF THE TRANSISTOR

(71) Applicant: COMMISSARIAT A L'ENERGIE ATOMIQUE ET AUX ENERGIES ALTERNATIVES, Paris (FR)

(72) Inventors: Shay Reboh, Grenoble (FR); Laurent Grenouillet, Claix (FR); Raluca Tiron, Saint-Martin le Vinoux (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/711,549

(22) Filed: Sep. 21, 2017

(65) Prior Publication Data

US 2018/0082837 A1   Mar. 22, 2018

(30) Foreign Application Priority Data

Sep. 22, 2016 (FR) ...................................... 16 58917

(51) Int. Cl.
*H01L 29/10* (2006.01)
*H01L 21/02* (2006.01)
(Continued)

(52) U.S. Cl.
CPC .... *H01L 29/1054* (2013.01); *H01L 21/02019* (2013.01); *H01L 21/02107* (2013.01);
(Continued)

(58) Field of Classification Search
CPC ....... H01L 29/66545; H01L 29/66795–66818; H01L 21/02381; H01L 29/7842–7849;
(Continued)

(56) References Cited

U.S. PATENT DOCUMENTS 9,508,853 B2 * 11/2016 Jacob .................. H01L 29/7851
2013/0323888 A1 * 12/2013 Morvan ............ H01L 29/66568
438/151

(Continued)

OTHER PUBLICATIONS

French Preliminary Search Report dated Feb. 1, 2017 in French Application 16 58917, filed on Sep. 22, 2016 (with English Translation of Categories of cited documents).

(Continued)

*Primary Examiner* — Laura M Menz
*Assistant Examiner* — Candice Chan
(74) *Attorney, Agent, or Firm* — Oblon, McClelland, Maier & Neustadt, L.L.P.

(57) ABSTRACT

There is provided a method for making a device including at least a strained semiconductor structure configured to form at least a transistor channel, including: forming, on a semiconductor layer, a sacrificial gate block and source and drain blocks on either side of the block, the semiconductor layer being a strained surface semiconductor layer disposed on an underlying insulating layer, with the underlying layer being disposed on an etch-stop layer; removing the block to form a cavity revealing a region of the strained surface layer configured to form the transistor channel; and etching, in the cavity, one or more portions of the region to define one or more semiconductor blocks and holes on either side, respectively, of the one or more blocks, the etching of holes extending into the underlying layer to form one or more galleries therein, etching of the galleries being stopped by the etch-stop layer.

17 Claims, 8 Drawing Sheets

(51) Int. Cl.
    *H01L 29/66* (2006.01)
    *H01L 29/78* (2006.01)
    *H01L 29/786* (2006.01)

(52) U.S. Cl.
    CPC .... *H01L 21/02381* (2013.01); *H01L 29/1037* (2013.01); *H01L 29/66545* (2013.01); *H01L 29/66636* (2013.01); *H01L 29/66742* (2013.01); *H01L 29/66772* (2013.01); *H01L 29/7848* (2013.01); *H01L 29/78654* (2013.01); *H01L 29/78684* (2013.01); *H01L 29/78696* (2013.01)

(58) Field of Classification Search
    CPC ........... H01L 29/1054; H01L 29/66606; H01L 29/66871; H01L 21/02107; H01L 21/02019
    See application file for complete search history.

(56) References Cited

U.S. PATENT DOCUMENTS

| | | |
|---|---|---|
| 2014/0054724 A1 | 2/2014 | Ching et al. |
| 2016/0077439 A1 | 3/2016 | Pimenta Barros et al. |
| 2016/0181439 A1 | 6/2016 | Augendre et al. |

OTHER PUBLICATIONS

B. Desalvo, et al. "A mobility enhancement strategy for sub-14nm power-efficient FDSOI technologies", IEEE International Electron Devices Meeting, 2014, 4 pages.

Tomohisa Mizuno, et al. "Advanced SOI p-MOSFETs with Strained-Si Channel on SiGe-on-Insulator Substrate Fabricated by SIMOX Technology", IEEE Transactions on Electron Devices, vol. 48, No. 8, 2001, 7 pages.

J.M. Hartmann, et al. "Reduced Pressure-Chemical Vapour Deposition of Si/SiGe heterostructures for nanoelectronics", Materials Science and Engineering B, vol. 154-155, 2008, 9 pages.

K. Cheng et al., "High Performance Extremely Thin SOI (ETSOI) Hybrid CMOS with Si Channel NFET and Strained SiGe Channel PFET", IEEE, 2012, 4 pages.

U. König et al., "Needs of low thermal budget processing in SiGe Technology", Solid State Phenomena, vol. 47-48, 1996, pp. 17-32.

L. Grenouillet et al. "UTBB FDSOI scaling enablers for the 10 nm node", IEEE, 2013, 2pages.

U.S. Appl. No. 14/555,897, filed Nov. 28, 2014, US 2015-0155170 A1, Shay Reboh, et al.

U.S. Appl. No. 14/575,329, filed Dec. 18, 2014, US 2015-0179474 A1, Sylvain Maitrejean, et al.

U.S. Appl. No. 14/719,580, filed May 22, 2015, US 2015-0338720 A1, Laurent Grenouillet, et al.

U.S. Appl. No. 14/950,416, filed Nov. 24, 2015, US 2016-0149039 A1, Shay Reboh, et al.

U.S. Appl. No. 15/070,781, filed Mar. 15, 2016, US 2016-0276494 A1, Sylvain Barraud, et al.

U.S. Appl. No. 15/092,002, filed Apr. 6, 2016, US 2016-0300927 A1, Shay Reboh, et al.

U.S. Appl. No. 15/261,226, filed Sep. 9, 2016, US 2017-0076997 A1, Shay Reboh, et al.

U.S. Appl. No. 15/335,123, filed Oct. 26, 2016, US 2017-0125458 A1, Oliver Rozeau, et al.S58886 US.

U.S. Appl. No. 15/490,212, filed Apr. 18, 2017, US 2017-0309483 A1, Shay Reboh, et al.

U.S. Appl. No. 15/452,049, filed Mar. 7, 2017, US 2017-0263607 A1, Sylvain Maitrejean, et al.S59147 US.

U.S. Appl. No. 15/523,742, filed May 2, 2017.
U.S. Appl. No. 15/602,829, filed May 23, 2017.
U.S. Appl. No. 15/603,738, filed May 24, 2017.

* cited by examiner

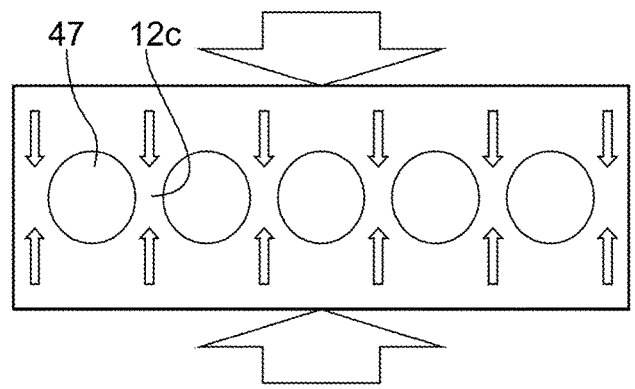
FIG.5
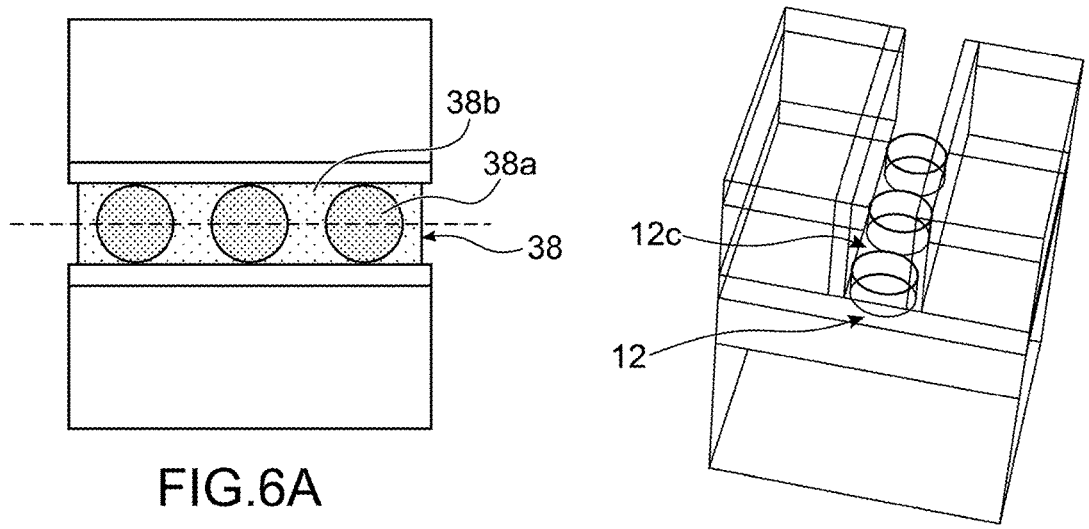
FIG.6A
FIG.6B
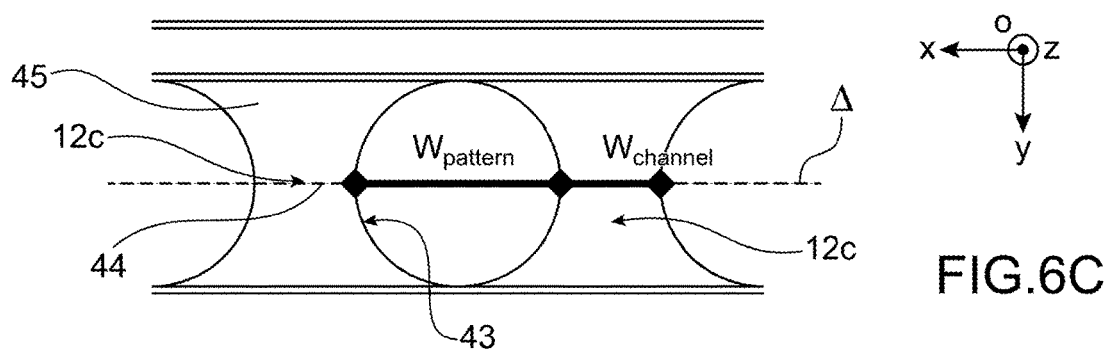
FIG.6C

METHOD TO INCREASE STRAIN IN A SEMICONDUCTOR REGION FOR FORMING A CHANNEL OF THE TRANSISTOR

TECHNICAL FIELD AND PRIOR ART

The present application relates to the field of transistor structures, and more particularly those equipped with a channel zone subjected to mechanical stress or strain.

The term mechanical strain refers to a material which has its crystal lattice parameter or parameters extended or shortened.

In the case where the strained lattice parameter is greater than the co-called "natural" parameter of a crystalline material, the latter is said to experience tensile strain. When the strained lattice parameter is smaller than the natural lattice parameter, the material is said to be experiencing compressive strain, or under compression.

A strain applied to a semiconductor material induces a change in the crystal lattice and therefore in its band structure, as a result of which the mobility of the carriers in this material is modified.

The mobility of the electrons is increased (respectively decreased) by a tensile strain (respectively compressive) of the semiconductor material wherein they pass, whereas the mobility of the holes will be increased (respectively decreased) when the semiconductor is compressive (respectively tensile).

Transistors can be made on a strained semiconductor surface layer of an insulating semiconductor type substrate.

The strain in this surface layer is generally a biaxial strain.

In order to improve the performance of a strained channel transistor, it may be desirable to relax the strain in a direction orthogonal to that in which the channel extends; in other words, in a direction that is orthogonal to the direction in which the transistor current is intended to flow.

A known method for increasing the strain in transistor channel structure is to provide source and drain regions based on a semiconductor material which has a lattice parameter which is different from that of the channel structure, in order to exert a strain on this structure. However, for some technologies where the transistor size is very small, further reductions in the surface area allocated to the source and drain are at the same time continually being sought. This makes this technique of inducing strain less and less effective.

The problem arises of finding a new method for inducing strain in a channel structure that is improved in terms of the above mentioned drawbacks.

DESCRIPTION OF THE INVENTION

One embodiment of the present invention envisages a method for making a device comprising at least a strained semiconductor structure capable of forming at least a transistor channel, where the method comprises steps for:

a) formation, on a semiconductor layer, of a sacrificial gate block and of source and drain blocks on either side of the sacrificial gate block, where the semiconductor layer is strained, b) removal of the sacrificial gate block so as to form a cavity, where the cavity reveals a region of the strained semiconductor layer wherein it is intended to form at least a transistor channel, c) etching in the cavity of one or more portions of said regions so as to define one or more distinct semi-conductor block and holes on either side respectively of said one or more distinct semiconductor blocks.

From the strained semiconductor layer strained with an initial biaxial strain, step c) is used to obtain separated block which strain is uni-axial and at a greater level relative to the initial strain.

Advantageously, the source and drain blocks may be made from a semiconductor material having a different lattice parameter to that of the semiconductor layer upon which these blocks are made in step a). This is in order to allow a strain to be applied to the material of said semiconductor layer or to increase the strain of the semiconductor layer when the latter has an intrinsic strain.

The strained semiconductor layer may be a surface semiconductor layer of a semiconductor-on-insulator type substrate, in particular of a strained semiconductor-on-insulator type substrate. In this case the surface semiconductor layer is arranged on and in contact with an insulating underlying layer.

A method as defined above applies to the implementation of an FDSOI type transistor.

According to one advantageous embodiment, the etching of the holes is extended into the underlying layer located beneath the strained semiconductor layer. This increases the level of strain in the blocks, as well as the uncovered surface area of the latter on which it is intended to deposit the gate.

When the etching of the holes is extended into the underlying layer, one or more galleries may be formed beneath the semiconductor block or blocks respectively.

Advantageously, the etching of the holes can be extended into the underlying layer so as to form one or more galleries which extend respectively beneath the semiconductor blocks in such a way that the semiconductor blocks are suspended above said galleries. A gate can then be formed which completely covers the semiconductor blocks.

One embodiment envisages that the strained semiconductor layer is a surface semiconductor layer resting on an insulating layer, where the insulating layer rests on an etch-stop layer. Thus, it can be arranged that the gallery or galleries formed by etching of the insulating layer do(es) not extend up to a semiconductor support layer of the substrate.

Alternatively, the strained semi-conductor layer is made of $Si_{1-a}Ge_a$ (where $a \geq 0$) resting on an underlying layer made of $Si_{1-z}Ge_z$ (where $z > a$).

According to one possible application of the method wherein the strained semiconductor layer is a surface semiconductor layer made of $Si_{1-a}Ge_a$ (where $a \geq 0$) resting on an underlying layer made of $Si_{1-z}Ge_z$ (where $z > a$), and wherein the etching of holes at step c) is extended into the underlying layer, so as to form one or more galleries respectively beneath the semiconductor block or blocks such that the semiconductor blocks are suspended above said galleries, the method may furthermore comprise, after step c) and before a gate formation step: a selective oxidation step of a portion of the underlying layer made of $Si_{1-z}Ge_z$ in relation to the surface layer made of $Si_{1-a}Ge_a$. This forms an insulating zone on a portion of the underlying layer made of $Si_{1-z}Ge_z$ in order to subsequently prevent direct contact of a gate on the underlying layer made of $Si_{1-z}Ge_z$.

According to one embodiment, the etching at step c) can be carried out through one or more openings in an etching mask comprising one or more rectangular shaped patterns. Thus parallelepiped semiconductor blocks can be formed.

According to another embodiment, the etching at step c) can be carried out through one or more openings in an etching mask comprising one or more circular or ovoid-shaped patterns. Thus semiconductor blocks which possess lateral faces which exhibit a curvature can be formed. Such a shape of semiconductor blocks allows increased strain levels to be achieved.

Advantageously, the etching mask can be made from a copolymer block.

Such an etching mask can allow small and regularly distributed patterns to be obtained. The use of a co-polymer block also allows a mask to be formed with specific patterns such patterns with a cylindrical or curved shape.

According to another aspect, the present application relates to a strained channel transistor structure formed from one or more distinct semiconductor blocks with curved lateral flanks and which form, in particular, the shape of an arc of a circle.

BRIEF DESCRIPTION OF THE DRAWINGS

The present invention will be better understood on reading the description of example embodiments given, purely as an indication and in no sense restrictively, making reference to the appended illustrations in which:

FIG. 5 shows another embodiment example for which the strained semiconductor layer is structured by making openings with a circular or ovoid-shaped cross-section in order to define a channel structure formed of blocks with curved lateral flanks;

FIGS. 6A-6C show an example of making cylindrical holes in the semiconductor layer using a copolymer block mask comprising cylindrical openings;

Figure 1A:
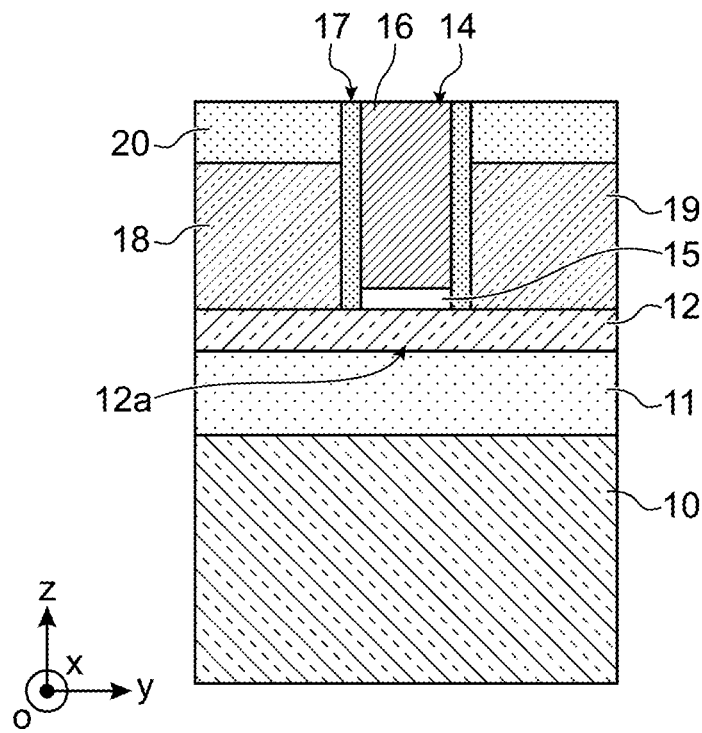
FIGS. 1A-1E show a first example of the method according to the invention wherein sectioning of an initial strained semiconductor layer is performed in a cavity in order to make a channel structure formed of one or more blocks which have a uni-axial strain which is increased in relation to the initial strain.

Identical, similar or equivalent portions of the various figures have the same numerical references, to make it easier to pass from one figure to another.

In order to make the figures more readable, the various parts shown in the figures are not necessarily shown at a uniform scale.

Moreover, in the description hereafter terms which depend on the orientation, such as "under", "on", "above", "upper", "surface", "lateral" etc. for a structure are applied assuming that the structure is oriented in the manner shown in the figures.

DETAILED DESCRIPTION OF PARTICULAR EMBODIMENTS

One example of a method for making a strained channel structure for a transistor will now be described in relation to FIGS. 1A-1E.

Advantageously, the transistor is made in accordance with an FDSOI (Fully Depleted Silicon on Insulator) technology.

The starting material for this method may be a semiconductor-on-insulator type substrate, and in particular a strained semiconductor on insulator type, for example of the sSOI (strained silicon on insulator) type, or cSiGeOI (compressive silicon germanium on insulator) type.

The substrate thus comprises a semiconductor support layer 10, for example Si-based, as well as an insulating layer 11, for example $SiO_2$ based, located on and in contact with the support layer 10. The insulating layer 11 may be, for example, of the BOX ("Buried Oxide") type, and have a thickness $e_1$ which may be for example between 15 nm and 150 nm. The substrate moreover comprises a so-called "surface" semiconductor layer 12, for example tension-strained Silicon-based or compression-strained Silicon Germanium based, arranged on and in contact with said insulating layer 11. This surface semiconductor layer 12 has a thickness $e_2$ which may be, for example, between 5 nm and 40 nm.

At least a sacrificial gate block 14 is formed facing a region 12a of the surface semiconductor layer 12, wherein it is intended to form a transistor channel. The sacrificial gate block 14 can be made by deposition of a stack comprising a layer of dielectric gate material 15 such as, for example, $SiO_2$ then a layer 16 of gate material 16 such as polySi, for example.

Photo-lithography and then etching steps may be carried out in order to define the block 14 of the sacrificial gate.

Insulating spacers 17, for example silicon nitride-based, are also formed on the lateral walls of the sacrificial gate block 14.

Source and drain semiconductor blocks 18, 19 are also made by epitaxial growth on the surface semiconductor layer 12 on either side of the semiconductor region 12a wherein it is intended to make the transistor channel structure.

Advantageously, the semiconductor blocks 18, 19 are formed from a semiconductor material which has a different lattice parameter from that of the semiconductor material of the surface layer 12, in order to be able to create a strain in the surface layer 12 or to increase the strain in the surface layer 12 when the latter already comprises an intrinsic strain, in particular when the substrate is of a strained semiconductor-on-insulator type. When, for example, it is wished to induce a compression strain, semiconductor blocks 18, 19 of $Si_{1-x}Ge_x$ (where $0<x\leq1$) may be formed on a surface semiconductor layer 12 made of silicon. Typically, the semiconductor blocks 18, 19 of $Si_{1-x}Ge_x$ have a Germanium concentration x of between 20% and 50%. According to another example, if it is wished to induce tensile strain, semiconductor blocks 18, 19 can be formed of Si:C, with a proportion of Carbon of between 1% and 2%, typically close to 1%.

A layer of dielectric material 20 of the ILD (Inter Dielectric Layer) type, for example made of $SiO_2$, is then deposited on the source and drain blocks 18, 19 and on the gate 14. Then CMP (Chemical Metal Planarization), also known as planarization, is carried out. This brings the upper face of the layer of dielectric material 20 to the same level as the upper face (also known as the top) of the sacrificial gate block 14. The layer of dielectric material 20 is therefore used to form a protective mask, whilst the sacrificial gate block 14 is revealed and is surrounded by this protective mask.

Thus a structure as shown in FIG. 1A is obtained.

Figure 1B:
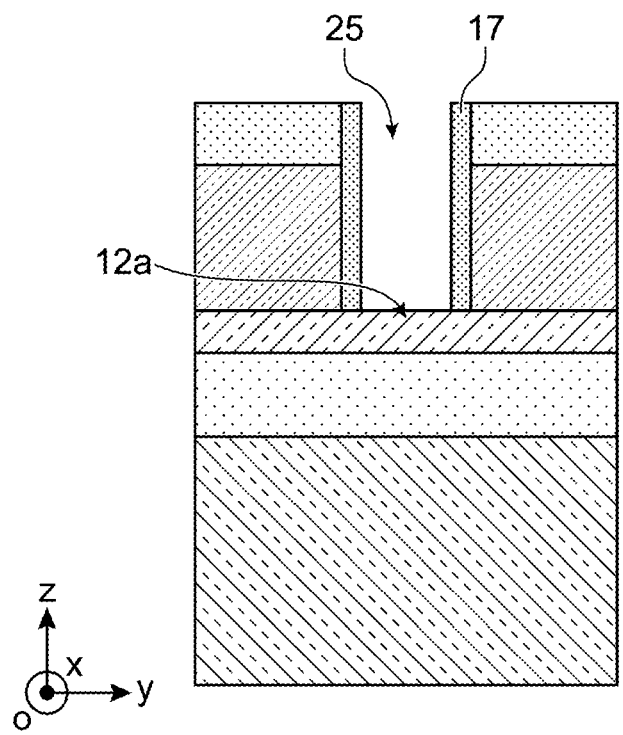

Then the sacrificial gate block 14 between the insulating spacers 17 is removed (FIG. 1B). This step ends with the formation of a cavity 25 between the spacers 17. The removal may be achieved, for example, by selective etching using an $NH_4OH$ technique in order to remove the polysilicon, and HF in order to remove the silicon dioxide. Alternatively, etching using TMAH can be performed.

Then sectioning of the region 12a of a portion of the surface semiconductor layer 12 revealed by the cavity 25 is performed. This sectioning is performed using etching, so as to form holes 27 in the semiconductor layer and define one or more distinct semiconductor blocks 12c in the cavity 25 (with FIGS. 1C and 1D respectively giving a top view and a perspective view). Each of the semiconductor blocks 12c is demarcated by holes 27 on either side, and typically has an oblong shape.

The semiconductor blocks 12c may, for example, be parallelepiped in shape and parallel to each other. Such blocks 12c are intended to form a transistor channel structure. The holes 27 are in this case slots of elongated shape arranged on either side of the parallelepiped blocks 12c.

The sectioning of the region 12a in particular increases the strain at the semiconductor block or blocks 12c relative to the initial strain in the sacrificial semi-conductor layer 12. Increasing the strain level in the channel structure thus improves the performance of the transistor.

Moreover, the structuring used to make oblong or elongated-shaped blocks 12c leads to relaxation of strain in a direction parallel to the principal plane of the substrate and orthogonal to that in which the blocks 12c extend. Here the term "principal plane" refers to a plane passing through the substrate and which is parallel to a plane [O; x; y] of the orthogonal reference [O; x; y; z], whereas the semiconductor blocks 12c are aligned in a direction parallel to the y axis.

The direction in which the relaxation is produced is parallel to the direction in which the width of the blocks 12c is measured. In other words, relaxation in a direction parallel to the x axis of the orthogonal reference [O; x; y; x] is produced. A strain (represented by means of arrows in FIG. 1C) is nevertheless preserved in blocks 12c in another direction corresponding to the direction in which the blocks 12c extend, that is, a direction taken parallel to the y-axis of the orthogonal reference [O; x; y; z].

The initial bi-axial strain in the surface semiconductor layer 12 becomes a uni-axial strain in the semiconductor blocks 12c. Such a transformation improves the performance of the transistor. The more uni-axial the compressive strain, the more beneficial it is to hole transport. Similarly, above 1.4 GPa, the more uni-axial the tensile strain, the more beneficial it is to electron transport.

It should also be noted that in the case, for example, where a channel structure is made in the direction <110> on a substrate with orientation <001>, the lateral faces of the sectioned blocks 12c primarily have an orientation {110}, favourable, therefore, for a PMOS type transistor.

Blocks 12c may be envisaged with a critical dimension $W_{channel}$ (dimension measured parallel to the plane [O; x; y]) of between, for example, 5 and 40 nm. The term "Critical dimension" means the smaller dimension of a pattern excluding its thickness. Moreover, a width $W_{pattern}$ of the holes 27, or in other words, a spacing between two semiconductor blocks 12c, of between for example 5 and 40 nm is envisaged. The dimensions $W_{channel}$ and $W_{pattern}$ are measured parallel to a median axis Δ (axis parallel to the plane [O; x; z]) of the cavity 25.

The sectioning of region of the semiconductor layer 12 revealed by the cavity 25 into blocks 12c may be achieved, for example, by direct writing. The term "direct writing" means that holes 27 are formed without using a mask, by using, for example, an electron beam ("e-beam"). Alternatively, a mask is formed in the cavity 25, and then etching of portions of the surface layer 12 that are not protected by this mask is carried out, so as to define semiconductor blocks 12c which, in this example, are parallelepiped in shape. The mask may be formed, for example, of a layer made of photosensitive resin wherein patterns are made. SIT ("Sidewall Image Transfer") technology or EUV ("Extreme Ultra Violet") photo-lithography may be employed.

Figure 1C:
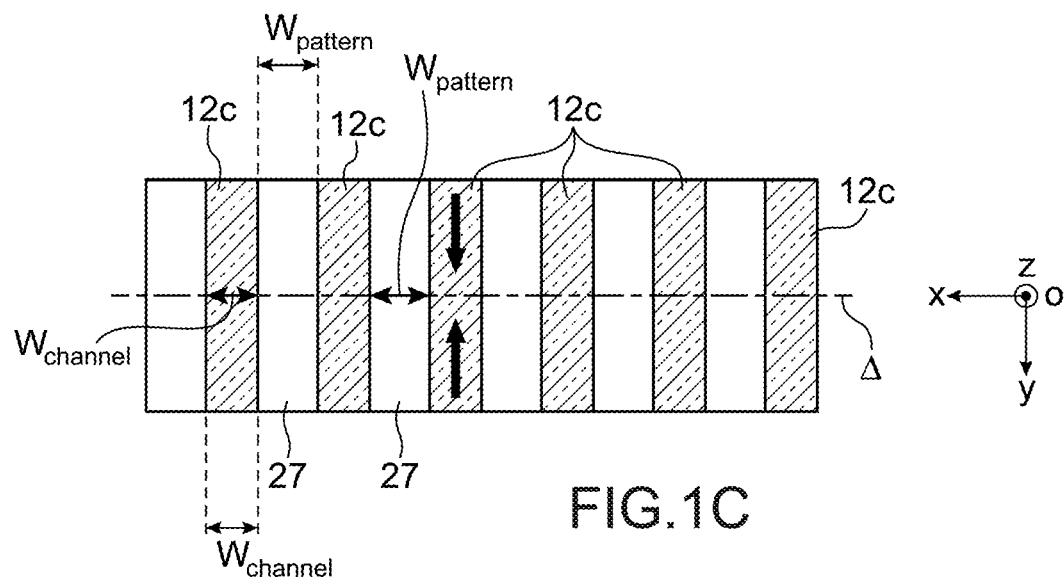
Figure 1D:
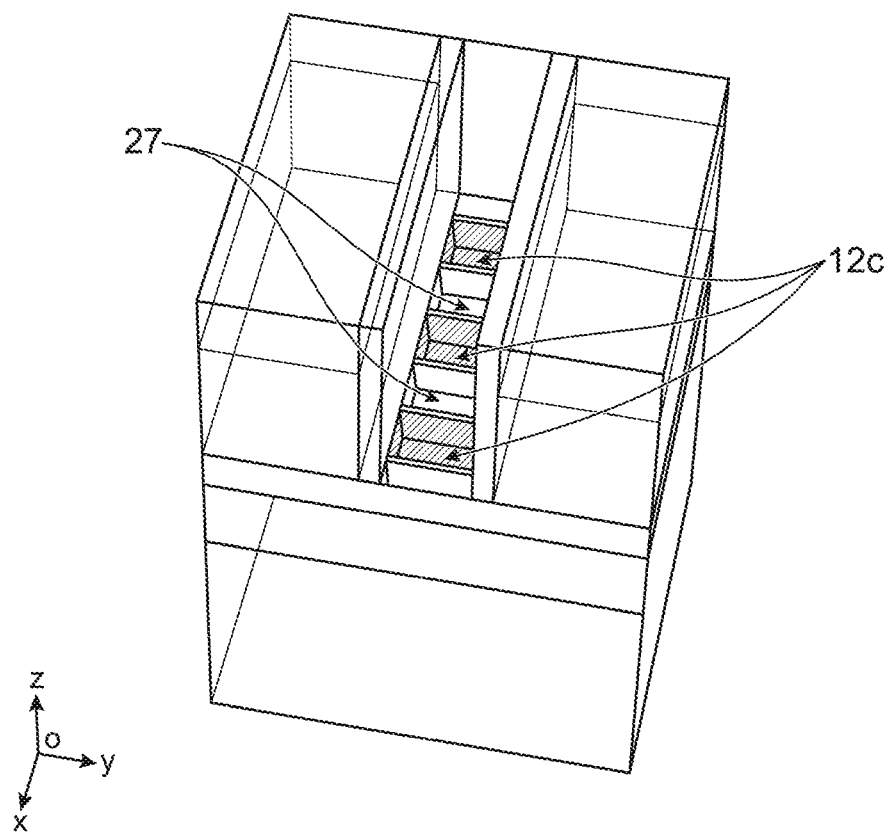
Figure 1E:
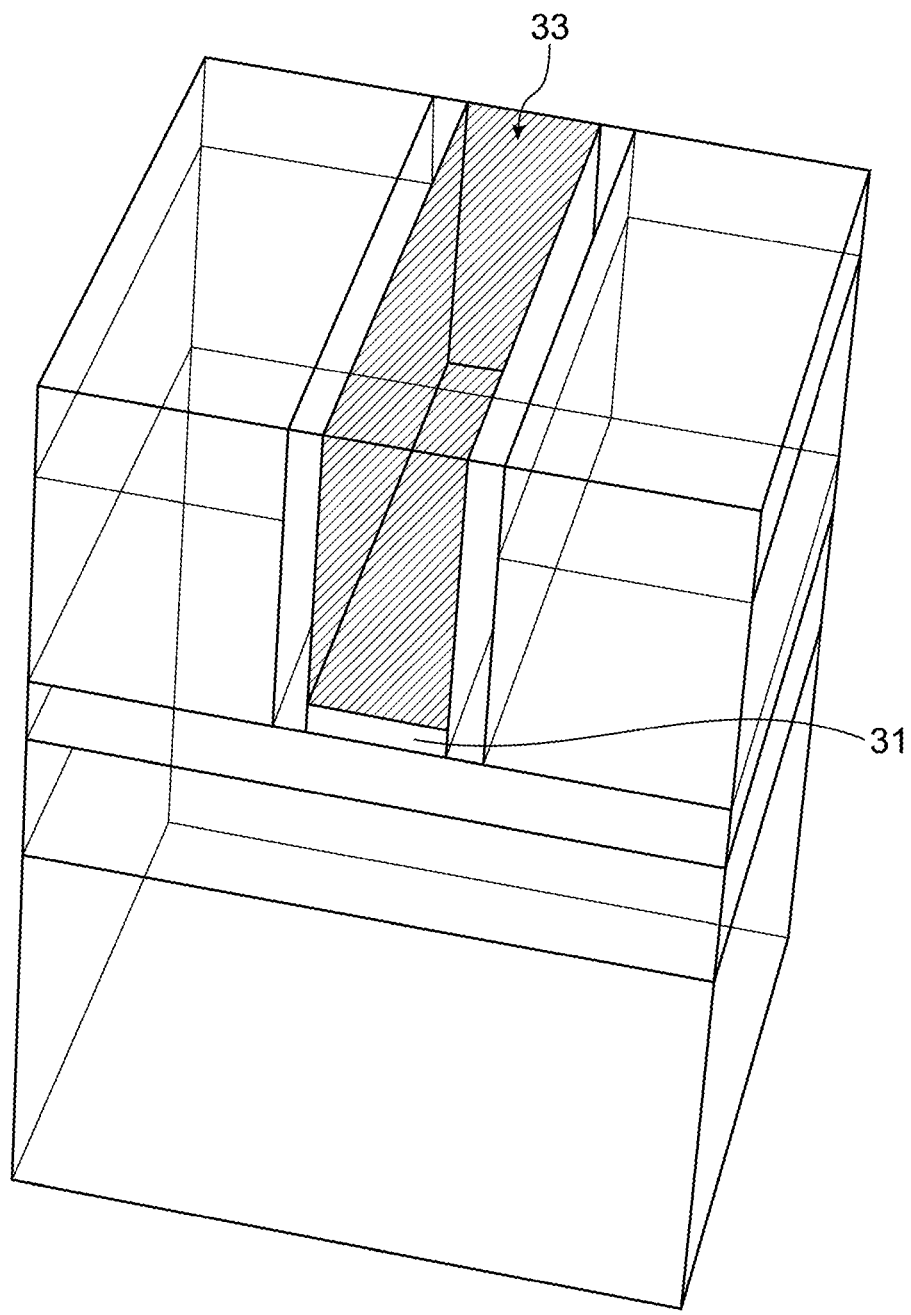

Then at least once gate dielectric 31 and at least a semiconductor or conductor material are deposited in order to fill the cavity 25 and form a gate 33 (FIG. 1E). The dielectric gate material 31 may be a dielectric which has a high dielectric constant, for example Hafnium dioxide ($HfO_2$). The gate material may be semiconductor-based, for example polysilicon or a metallic material, for example titanium nitride (TiN). A step to remove excess material may then be carried out, for example by a CMP ("Chemical Mechanical Planarization") method.

An alternative to the example of a method described above envisages that when the semiconductor blocks 12c are being sectioned, or after sectioning of the semiconductor blocks 12c has been performed, the etching into the insulating layer 11, upon which the surface semiconductor layer 12 rests, is extended. This increases the contact surface area between the channel structure and the gate, resulting in improved control of the channel.

Thus a first anisotropic etching, for example by RIE (Reactive Ion Etching), is carried out to define the lateral flanks of the blocks 12c, then a second etching, this type isotropic in nature, is performed in order to etch, at least partially, portions of the insulating layer 11 located beneath and in contact with the blocks 12c.

Figure 2A:
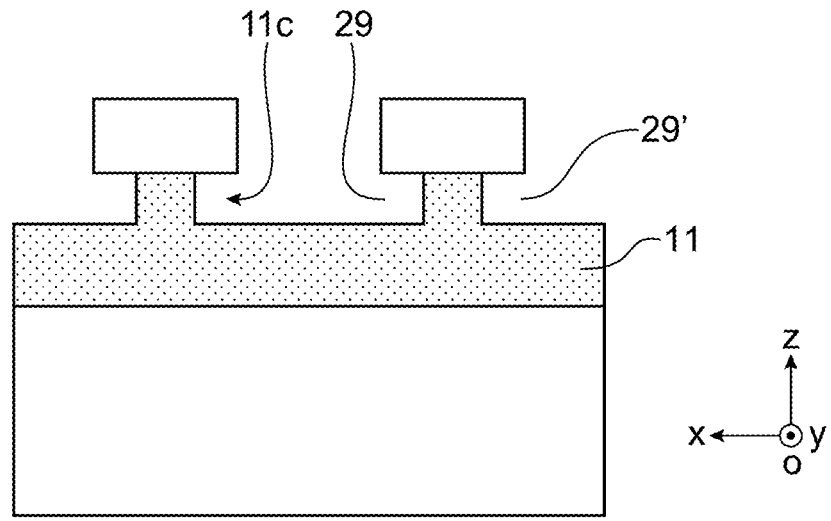
FIGS. 2A-2B show an alternative embodiment of the first method example for which the galleries are formed beneath the channel structure.

FIG. 2A shows one particular embodiment wherein non-etched zones 11c of the insulating layer 11, upon which the semiconductor blocks 12c rest, are retained. These non-etched zones 11c have respective widths which are less than that of the blocks 12c, such that galleries 29, 29' are formed on either side of the non-etched zones 11c which extend beneath the semiconductor blocks 12c.

Figure 2B:
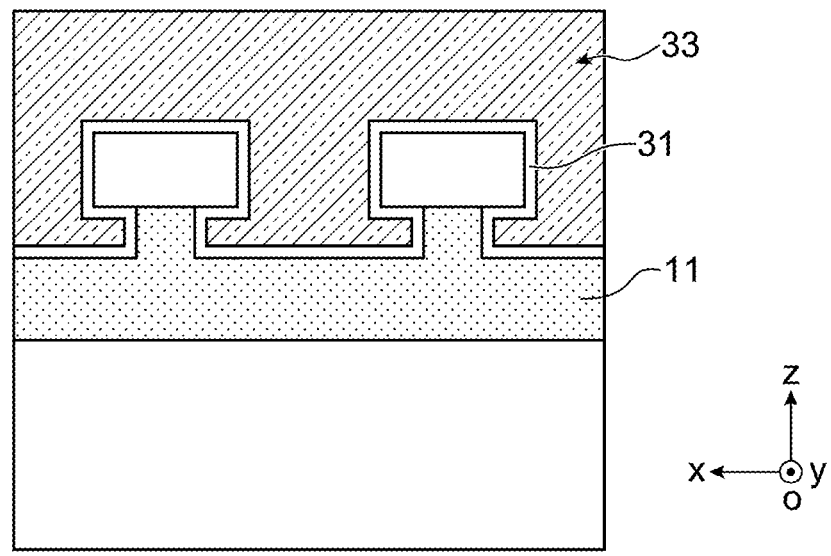

According to one alternative of the embodiment example described above, this time the gate dielectric 31 of semiconductor material is then deposited in order to form a gate 33 which partially surrounds the blocks 12c (FIG. 2B).

The release of the blocks 12c by etching the insulating layer 11 may be such that a portion of the insulating later 11 is retained opposite the spacers 17 in order to prevent the gate extending opposite the source and drain regions, or such that the length of overlap of the gate facing the source and drain regions remains small, preferably less than 5 nm.

Figure 3A:
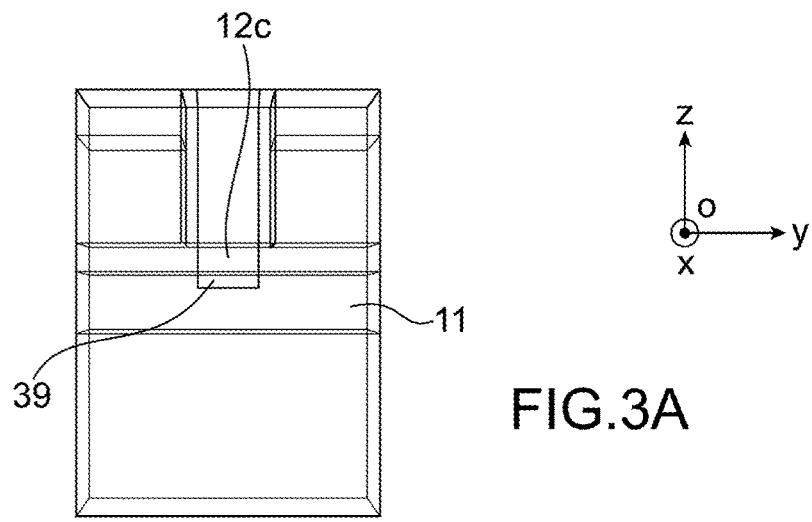
FIGS. 3A-3C show another alternative embodiment wherein the semiconductor blocks of the channel structure are suspended.
Figure 3B:
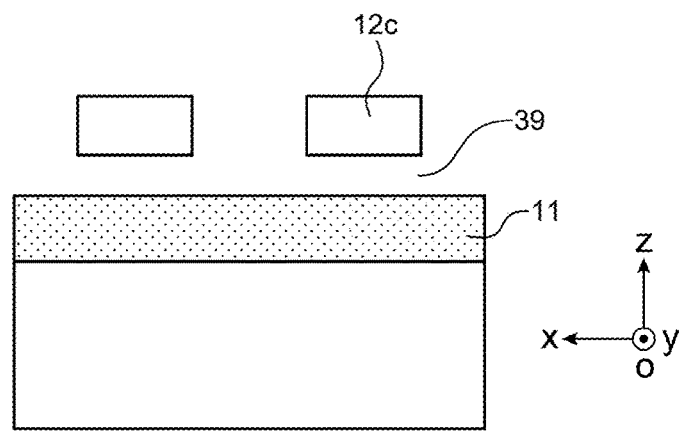
Figure 3C:
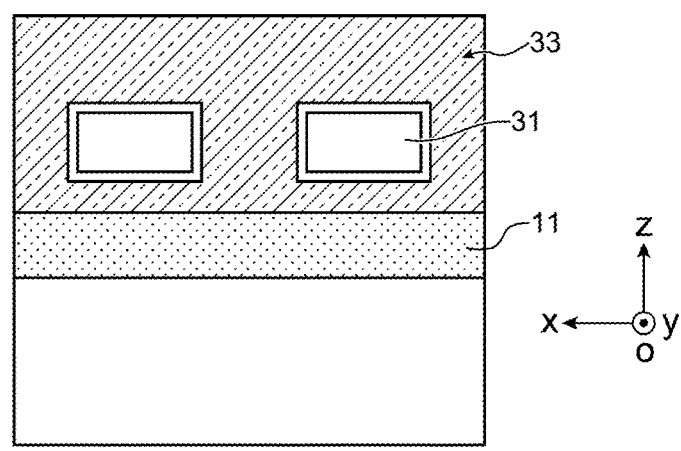

According to one alternative shown in FIGS. 3A-3C, the etching of the insulating layer 11 is carried out in such a way as not to retain the zone of the insulating layer 11 in contact with the semiconductor blocks 12c, with these semiconductor blocks then being suspended in the cavity 25. A gallery 39 thus extends beneath each suspended semiconductor block 12c, and separates this block 12c from the insulating layer 11 of a remaining thickness of the BOX insulating layer (FIGS. 3A and 3B).

A portion of the gate 33 is then formed and arranged in such a way as to fully coat the semiconductor blocks 12c (FIG. 3C).

According to one advantageous embodiment, the sectioning of the blocks 12c described above in relation, for example, to FIGS. 1C and 1D may be carried out by etching using an etching protection mask 28 formed from copolymer block.

The copolymer block may be a di-copolymer block (formed from two monomers A and B) or a multi-copolymer block (more than two monomers), a blend of polymers, a blend of copolymers or a mixture of a copolymer and a homopolymer.

Figure 4A:
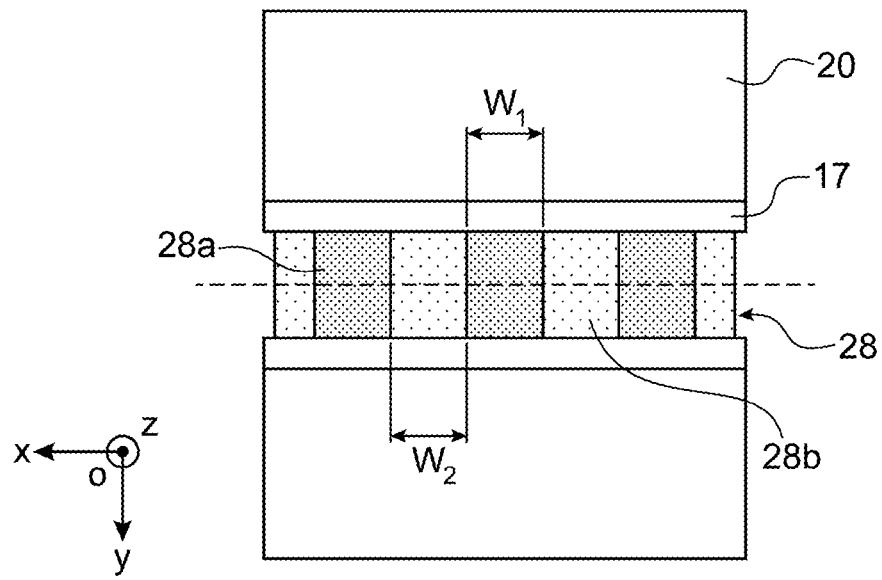
FIGS. 4A-4B show another alternative embodiment for which the sectioning of the strained semiconductor layer into distinct semiconductor blocks is achieved by etching through one or more openings in a mask made of copolymer block.

The mask 28 may in this case be formed from alternating first patterns 28a made of a first polymer and second patterns 28b made of a second polymer (FIG. 4A shows a top view of the structure). The first and second patterns are in a first example in the form of parallelepiped strips. Copolymer blocks in particular allow very small patterns with a high density to be achieved in an auto-aligned manner. An example of a di-copolymer block that can be used is composed of polystyrene (PS) and of poly (methyl methacrylate) (PMMA). According to other examples, PS-PLA or PS-PDMS or PLA-PDMS are used to form the mask 28.

The use of the mask 28 made of copolymer block in the cavity 25 can follow a method such as that described, for example, in document EP2°998°981 A1.

Prior to the formation of the mask 28 in the cavity 25, a surface preparation of the lateral walls and of the bottom of the cavity 25 is typically carried out in order to increase the affinity of the copolymer mask 28 with the lateral walls and with the bottom of the cavity 25.

The surface preparation can be performed by carrying out UV treatment or by forming a thin "bonding" layer on the lateral walls and bottom of the cavity 25. This thin bonding layer is made, for example, by the formation or grafting of a statistical copolymer or of a self-assembled monolayer (SAM) molecular monolayer. The surface preparation can be performed so as to favour the arrangement of regions of the block polymer, for example perpendicularly to the surface on which the latter is to be deposited. The surface preparation may be implemented at once over the entire surface of the cavity, that is, on the bottom and the flanks of the cavity. In the case where surface preparation is performed by grafting of a statistical polymer, the latter can be formed by spin-coating deposition, then by thermal treatment. After this thermal treatment, washing is performed using a solvent in order to eliminate non-grafted polymer.

Then the copolymer matrix is deposited. Typically, thermal annealing is then performed in order to separate the deposited material into two phases.

Thus the alternating first patterns 28a and second patterns 28b are made. Then portions of the polymer located outside the cavity 25, in particular on the layer of dielectric material 20 are removed using for example, planarization, in particular using a laser, such that the mask 28 is only retained in the cavity 25.

Figure 4B:
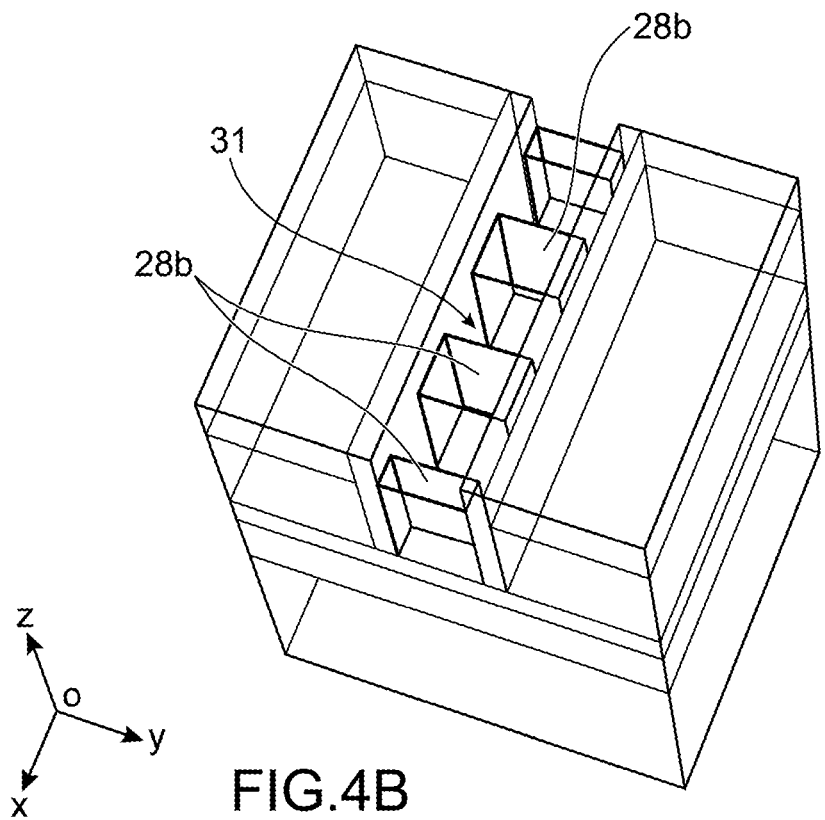

Then a selective removal of the first patterns 28a is carried out in order to form openings 31 in the mask 28 (with FIG. 4B showing a perspective view of the structure). This removal can be carried out using dry or wet etching, preceded if necessary by UV treatment.

According to one specific embodiment of the mask 28 from made from a PS-b-PMMA type copolymer with a PS proportion of 50%, a bonding layer, for example based on PS-r-PMMA with a proportion of PS of 50%, may be envisaged. The grafting step may then be carried out by a thermal treatment step at a temperature, for example, of the order of 230° C., over a period of ten minutes or so followed by washing in a solvent such as, for example, PGMEA (Propylene glycol methyl ether acetate). After the PS-b-PMMA deposition, the separation into two phases may be carried out using thermal annealing at a temperature, for example, of the order of 250° C. over a period of ten or so minutes. Then the first patterns made of PMMA are selectively removed, for example so as to retain the second patterns made of PS, by plasma etching. Other copolymers can be used, such as PS-PLA, PS-PDMS, and PLA-PDMS in order to make the mask 28.

Once it is made, the mask 28 is then used to carry out the sectioning of the strained semiconductor layer 12 into distinct blocks through the openings 31.

Then once this sectioning has been performed, the second patterns 28b of the mask 28 arranged on the semiconductor backs 12c are removed. This removal is performed, for example, by plasma etching.

According to one alternative to the method described above, a channel structure comprised of semiconductor blocks which have lateral edges of curved shaped can be made in order to obtain a channel structure which has increased strain and improved performance.

A specific embodiment of such a channel structure is shown in FIG. 5, with semiconductor blocks 12c which have lateral flanks which profile forms a part of a circle. The sectioning of the semiconductor layer 12 is such that the semiconductor blocks 12c are separated by holes 47 which have a disc-shaped section.

In order to obtain blocks 12c with such a shape, after the cavity 25 is formed (according to a method for example as described in connection with FIGS. 1A-1B) a copolymer-based mask 38 may be formed in this cavity 25, with this mask 38 having alternating first patterns 38a made of a first polymer and second patterns 38b made of second polymer. In the example shown in FIG. 6A, the first patterns 38a are cylinders which base is circular and rests on a semiconductor layer 12. The cylinders advantageously have a base which diameter corresponds to the separation between the spacers 17. In other words, the diameter of the base of the cylinders corresponds to the separation between the lateral walls of the cavity 25. The diameter of the base of the cylinders may, for example, be of the order of one or several tens of manometers.

Then a selective removal of the first patterns 38a is carried out then etching of the portions of the semiconductor layer 12 located in the cavity 25 and which are not protected by the second patterns 38b. The removed portions of the semiconductor layer 12 are cylindrical so that cylindrical holes 47 are formed in the semiconductor layer 12.

The second patterns 38b made of a polymer material are then removed in order to reveal semiconductor blocks 12c resulting from the etching of the semiconductor layer 12 through openings in the mask 38 (FIG. 6B).

These semi-conductor blocks 12c possess curved lateral flanks 43, with the curvature of the lateral flanks being such that these blocks 12c possess extremities 45 which are flared in relation to a narrowed central part 44. The lateral flanks 43 of the blocks 12c thus have a gap which gradually decreases as one moves away from the source and drain regions and approaches a median axis Δ of the cavity 25, with this axis Δ passing in the cavity 25 through the blocks 12c and being located between the source and drain regions. Such a block shape 12c gives increased strain in the channel structure.

The critical dimension $W_{channel}$ of the semiconductor blocks 12c and the maximum separation $W_{pattern}$ from one block 12c to another are adapted according to the desired strain level. The critical dimension $W_{channel}$ and the maximum separation $W_{pattern}$ are dimensions taken parallel to the x axis of the orthogonal reference [O; x; y; z].

A first dimension is defined which corresponds to a surface area of the cumulative cross-section of all of the semiconductor blocks 12c of the semiconductor layer 12 which link the source and drain regions, where the transverse section is taken in the central part of the semiconductor blocks 12c. Moreover a second dimension is defined which corresponds to a cumulative cross-section of the semiconductor layer 12 before it is structured to form the blocks 12c.

A variable $A_{eff}$ which corresponds to the ratio of the first dimension to the second dimension is also defined. In the embodiment examples in FIGS. 1C and 6C, when the thickness of the semiconductor layer 12 (dimension measured parallel to the axis z of the reference [O; x; y; z] is constant, then $A_{eff}=W_{channel}/(W_{pattern}+W_{channel})$, where $W_{pattern}$ and $W_{channel}$.

A dimension known as the internal step $P_{int}$ is also defined, such that $P_{int}=W_{pattern}+W_{channel}$.

In addition the effective modification of the width of the channel $W_{eff}$ is also defined as the perimeter of a transverse section of the channel formed by all the semiconductor blocks 12c controlled by the gate, in comparison with the original perimeter before structuring.

In the case where structuring of the strained semiconductor layer 12 is carried out by stopping when the BOX insulating layer 11 is reached, then:

$W_{eff}=(W_{channel}+2*h_{channel})/(W_{pattern}+W_{channel})$, where $h_{channel}$ is the height of the channel measured along the z axis of the orthogonal reference [O; x; y; z].

In the case where structuring of the strained semiconductor layer 12 is carried out by extending the etching into the BOX insulating layer 11, as shown in FIG. 3B, then:

$$W_{eff}=(W_{channel}+2*h_{channel})/(W_{pattern}+W_{channel}).$$

Results of modelling carried out using a tool such as COMSOL Multiphysics® show that for a given Aeff value the strain tends to increase when the internal step Pint is reduced.

Similarly, modelling results show that by envisaging a semiconductor block 12c shape with curved lateral flanks, the channel structure strain is further increased.

The modelling was performed by considering a support layer 10 made of silicon, an insulation layer 11 made of silicon dioxide. The source and drain regions are made of silicon germanium with a Germanium concentration of 25%, whereas the spacers 17 are made of silicon nitride.

Simulations were carried out for four different configurations:

i) A first configuration C1 envisages a channel structure formed of parallelepiped blocks made of Si, tensile strained and which has a layout of the type as shown in FIG. 1C, with the source and drain regions being made of SiGe;

ii) A second configuration C2 envisages a structure with a channel of Si which has a layout with suspended parallelepiped blocks of the type as shown in FIG. 3B, with the source and drain regions being made of SiGe;

iii) A third configuration C3 envisages a structure with a channel formed of parallelepiped blocks made of SiGe, strained under compression, and which has a layout of the type as shown in FIG. 1C, with the source and drain regions being made of SiGe;

iv) a fourth configuration envisages a structure with a channel formed of suspended parallelepiped blocks made of SiGe which has a layout of the type as shown in FIG. 3B, with the source and drain regions being made of SiGe.

Simulations were also carried out for four other different configurations:

a) a configuration C'1 envisages a structure with a channel made of Si, tensile strained, formed of semiconductor blocks with lateral flanks which are curved and in particular which form the arc of a circle, according to a layout of the type as shown in FIG. 5, with the source and drain regions being made of SiGe;

b) a configuration C'2 envisages a structure with a channel made of Si and a layout of the same type as that in FIG. 6B with suspended semiconductor blocks with curved lateral flanks, where the source and drain regions are made of SiGe;

c) a configuration C'3 envisages a structure with a channel made of SiGe strained under compression and which has a layout of the same type as that in FIG. 5 with blocks with curved lateral flanks, where the source and drain regions are made of SiGe;

d) a configuration C'4 envisages a channel structure made of SiGe and a layout of the same type as that in FIG. 6B with suspended semiconductor blocks with curved lateral flanks, in particular in the form of an arc of a circle, where the source and drain regions are made of SiGe.

Results of these simulations are listed in the tables below, which give values of the parameter $W_{eff}$, absolute strain values and values of the strain increase factor relative to a mean strain taken in a direction of the charge carriers in a transverse section plane passing along the median axis Δ.

| | | Parallelepiped blocks | | | Configuration C1 (Ref strain = 0.823 Gpa) | | | Configuration C2 | | | Configuration C3 (Ref strain = 2.7 Gpa) | | | Configuration C4 Strain | | |
|---|---|---|---|---|---|---|---|---|---|---|---|---|---|---|---|---|
| Aeff | Pint | h Channel (nm) | WPattern (nm) | WChannel (nm) | Strain (GPa) | Strain increase (%) | Weff | Strain (GPa) | Strain increase (%) | Weff | Strain (GPa) | Strain increase (%) | Weff | Strain (GPa) | Strain increase (%) | Weff |
| 0.50 | 10 | 6 | 5 | 5 | −0.97 | 17.94 | 1.70 | −1.01 | 23.01 | 2.20 | −3.03 | 12.21 | 1.70 | −3.14 | 16.32 | 2.20 |
| 0.67 | 15 | 6 | 5 | 10 | −0.90 | 9.51 | 1.47 | −0.93 | 12.79 | 2.13 | −2.82 | 4.27 | 1.47 | −2.88 | 6.72 | 2.13 |
| 0.75 | 20 | 6 | 5 | 15 | −0.88 | 6.45 | 1.35 | −0.90 | 9.10 | 2.10 | −2.74 | 1.49 | 1.35 | −2.79 | 3.33 | 2.10 |
| 0.80 | 25 | 6 | 5 | 20 | −0.86 | 4.88 | 1.28 | −0.88 | 7.23 | 2.08 | −2.70 | 0.10 | 1.28 | −2.74 | 1.63 | 2.08 |
| 0.33 | 15 | 6 | 10 | 5 | −1.05 | 27.14 | 1.13 | −1.11 | 34.51 | 1.47 | −3.28 | 21.35 | 1.13 | −3.44 | 27.39 | 1.47 |
| 0.50 | 20 | 6 | 10 | 10 | −0.95 | 15.18 | 1.10 | −0.98 | 19.65 | 1.60 | −2.97 | 9.98 | 1.10 | −3.06 | 13.50 | 1.60 |
| 0.60 | 25 | 6 | 10 | 15 | −0.91 | 10.43 | 1.08 | −0.94 | 13.92 | 1.68 | −2.85 | 5.59 | 1.08 | −2.92 | 8.17 | 1.68 |
| 0.67 | 30 | 6 | 10 | 20 | −0.89 | 7.87 | 1.07 | −0.91 | 10.85 | 1.73 | −2.79 | 3.26 | 1.07 | −2.84 | 5.37 | 1.73 |
| 0.57 | 35 | 6 | 15 | 20 | −0.90 | 9.63 | 0.91 | −0.93 | 13.12 | 1.49 | −2.84 | 5.16 | 0.91 | −2.91 | 7.71 | 1.49 |
| 0.50 | 30 | 6 | 15 | 15 | −0.93 | 12.63 | 0.90 | −0.96 | 16.82 | 1.40 | −2.92 | 7.99 | 0.90 | −3.00 | 11.15 | 1.40 |

-continued

| | | Parallelepiped blocks | | | Configuration C1 (Ref strain = 0.823 Gpa) | | | Configuration C2 | | | Configuration C3 (Ref strain = 2.7 Gpa) | | | Configuration C4 Strain | | |
|---|---|---|---|---|---|---|---|---|---|---|---|---|---|---|---|---|
| Aeff | Pint | hChannel (nm) | WPattern (nm) | WChannel (nm) | Strain (GPa) | Strain increase (%) | Weff | Strain (GPa) | Strain increase (%) | Weff | Strain (GPa) | Strain increase (%) | Weff | Strain (GPa) | in-crease (%) | Weff |
| 0.40 | 25 | 6 | 15 | 10 | −0.97 | 18.31 | 0.88 | −1.02 | 23.75 | 1.28 | −3.06 | 13.24 | 0.88 | −3.17 | 17.56 | 1.28 |
| 0.25 | 20 | 6 | 15 | 5 | −1.09 | 31.83 | 0.85 | −1.16 | 40.78 | 1.10 | −3.40 | 26.07 | 0.85 | −3.60 | 33.41 | 1.10 |
| 0.50 | 40 | 6 | 20 | 20 | −0.91 | 10.68 | 0.80 | −0.94 | 14.54 | 1.30 | −2.87 | 6.29 | 0.80 | −2.95 | 9.17 | 1.30 |
| 0.43 | 35 | 6 | 20 | 15 | −0.94 | 14.11 | 0.77 | −0.98 | 18.72 | 1.20 | −2.96 | 9.46 | 0.77 | −3.05 | 13.04 | 1.20 |
| 0.33 | 30 | 6 | 20 | 10 | −0.99 | 20.28 | 0.73 | −1.04 | 26.35 | 1.07 | −3.11 | 15.16 | 0.73 | −3.24 | 20.05 | 1.07 |
| 0.20 | 25 | 6 | 20 | 5 | −1.11 | 34.58 | 0.68 | −1.19 | 44.47 | 0.88 | −3.48 | 28.76 | 0.68 | −3.70 | 36.97 | 0.88 |

| | | Blocks with curved lateral flanks | | | Configuration C'1 (Ref strain = 0.823 Gpa) | | | Configuration C'2 | | | Configuration C'3 (Ref strain = 2.7 Gpa) | | | Configuration C'4 Strain | | |
|---|---|---|---|---|---|---|---|---|---|---|---|---|---|---|---|---|
| Aeff | Pint | hChannel (nm) | WPattern (nm) | WChannel (nm) | Strain (GPa) | Strain increase (%) | Weff | Strain (GPa) | Strain increase (%) | Weff | Strain (GPa) | Strain increase (%) | Weff | Strain (GPa) | in-crease (%) | Weff |
| 0.50 | 10 | 6 | 5 | 5 | −1.12 | 36.33 | 1.70 | −1.16 | 40.52 | 2.20 | −3.54 | 31.03 | 1.70 | −3.64 | 34.95 | 2.20 |
| 0.67 | 15 | 6 | 5 | 10 | −0.97 | 18.17 | 1.47 | −1.00 | 20.95 | 2.13 | −3.07 | 13.61 | 1.47 | −3.13 | 15.83 | 2.13 |
| 0.75 | 20 | 6 | 5 | 15 | −0.92 | 12.12 | 1.35 | −0.94 | 14.42 | 2.10 | −2.91 | 7.73 | 1.35 | −2.95 | 9.38 | 2.10 |
| 0.80 | 25 | 6 | 5 | 20 | −0.90 | 9.06 | 1.28 | −0.91 | 11.13 | 2.08 | −2.83 | 4.73 | 1.28 | −2.86 | 6.10 | 2.08 |
| 0.33 | 15 | 6 | 10 | 5 | −1.27 | 53.89 | 1.13 | −1.33 | 61.15 | 1.47 | −3.99 | 47.89 | 1.13 | −4.20 | 55.73 | 1.47 |
| 0.50 | 20 | 6 | 10 | 10 | −1.05 | 27.48 | 1.10 | −1.08 | 31.69 | 1.60 | −3.32 | 22.90 | 1.10 | −3.43 | 27.13 | 1.60 |
| 0.60 | 25 | 6 | 10 | 15 | −0.97 | 18.31 | 1.08 | −1.00 | 21.57 | 1.68 | −3.08 | 14.08 | 1.08 | −3.16 | 17.10 | 1.68 |
| 0.67 | 30 | 6 | 10 | 20 | −0.94 | 13.76 | 1.07 | −0.96 | 16.54 | 1.73 | −2.96 | 9.59 | 1.07 | −3.02 | 12.00 | 1.73 |
| 0.57 | 35 | 6 | 15 | 20 | −0.95 | 15.91 | 0.91 | −0.98 | 19.35 | 1.49 | −3.03 | 12.06 | 0.91 | −3.11 | 15.27 | 1.49 |
| 0.50 | 30 | 6 | 15 | 15 | −1.00 | 21.17 | 0.90 | −1.03 | 25.29 | 1.40 | −3.17 | 17.25 | 0.90 | −3.27 | 21.29 | 1.40 |
| 0.40 | 25 | 6 | 15 | 10 | −1.08 | 31.52 | 0.88 | −1.13 | 37.10 | 1.28 | −3.44 | 27.24 | 0.88 | −3.59 | 32.91 | 1.28 |
| 0.25 | 20 | 6 | 15 | 5 | −1.32 | 60.61 | 0.85 | −1.10 | 70.30 | 1.10 | −4.17 | 54.60 | 0.85 | −4.45 | 64.91 | 1.10 |
| 0.50 | 40 | 6 | 20 | 20 | −0.96 | 16.86 | 0.80 | −0.99 | 20.72 | 1.30 | −3.06 | 13.27 | 0.80 | −3.16 | 16.91 | 1.30 |
| 0.43 | 35 | 6 | 20 | 15 | −1.01 | 22.39 | 0.77 | −1.05 | 27.14 | 1.20 | −3.21 | 18.76 | 0.77 | −3.33 | 23.34 | 1.20 |
| 0.33 | 30 | 6 | 20 | 10 | −1.10 | 33.22 | 0.73 | −1.15 | 39.64 | 1.07 | −3.49 | 29.14 | 0.73 | −3.66 | 35.49 | 1.07 |
| 0.20 | 25 | 6 | 20 | 5 | −1.34 | 62.28 | 0.68 | −1.43 | 73.48 | 0.88 | −4.23 | 56.65 | 0.68 | −4.54 | 67.97 | 0.88 |

It can be seen that for the configurations C1 and C'1 with a maximum separation $W_{pattern}$ of 10 nm and a critical dimension $W_{channel}$ of 5 nm, the strain increase due to the sectioning of the surface semiconductor layer into parallelepiped block can be of the order of 27%, whereas that due to the sectioning of the surface semiconductor layer into blocks with lateral flanks in the form of an arc of a circle may be of the order of 54%.

When a release of the channel structure (configurations C2 and C'2) is carried out the strain increase for the structure with flanks in the form of arcs of a circle may be of the order of 60% and the parameter $W_{eff}$ increases by an order of 50%.

When a structure is considered such that $W_{pattern}=W_{channel}=20$ nm with a release of the channel, a strain increase of 15 to 20% and a 30% increase in the parameter $W_{eff}$ may be obtained. The parameter $W_{eff}$ can be increased by reducing the internal step Pint and by carrying out a release of the channel structure.

For example when $W_{pattern}=20$ nm, $W_{channel}=5$ nm, the strain increase may be of the order of 70% for a channel structure released from the BOX insulating layer.

As previously stated, the method described above of sectioning of the surface semiconductor layer 12 into blocks 12c not only has the advantage of improving the strain level of the channel structure but also increases the uni-axial character of this strain. In other words, the uni-axial character of the strain can be increased when the internal step $P_{int}$ is reduced, for a given dimension $A_{eff}$.

The document by DeSalvo et al. "a mobility enhancement strategy for sub-14 nm power-efficient FDSOI technologies", IEDM 2014 shows that performance in terms of carrier mobility (holes or electrons) can be greatly improved by moving from a biaxial strain to a uni-axial strain, in particular when the strain level is high and for example greater than 2.5 GPa for tensile strain and −2.5 GPa for compressive strain.

Thus by altering the geometry of the semiconductor blocks obtained by sectioning of the surface semiconductor layer, the strain level in the channel, as well as the uni-axial character of this strain can be increased and/or the parameter $W_{eff}$ can be increased depending on the requirements in terms of overall dimensions and of performance.

Figure 7:
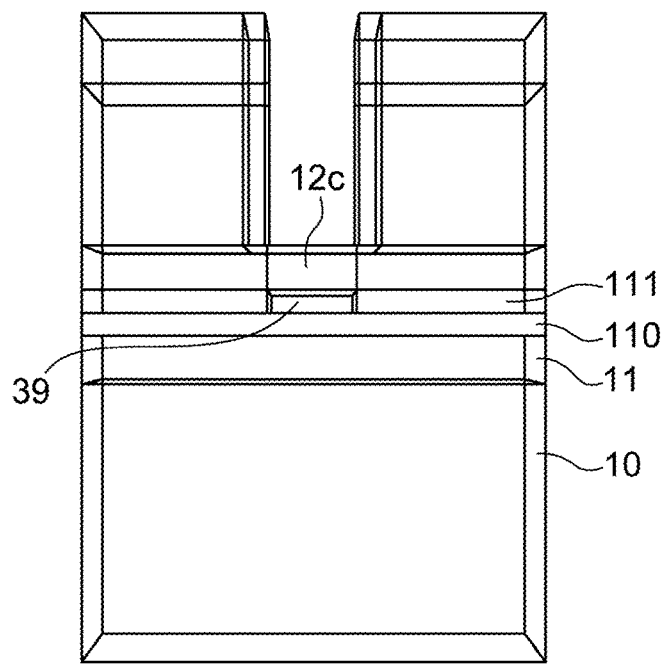
FIG. 7 show an alternative embodiment for which a layer of etch-stop is provided beneath the strained semiconductor layer that is etched to form the semiconductor block or blocks with increased strain.

One specific embodiment is shown in FIG. 7. This relates to the case in which, during the creation of semiconductor blocks 12c the latter are released by etching a portion of the insulating layer 11.

In order to avoid etching unwanted portions and taking away too much thickness from the insulating layer 11, an etch-stop layer 110 could be envisaged. This basis for this layer is a material, which is preferably insulating, capable of withstanding etching of the insulating layer 11. The insulating material is for example SiN, whilst the insulating layer 11 is made of silicon oxide.

By using such an etch-stop layer 110 the shape of the gallery 39 created beneath the suspended semiconductor blocks 12c is more precisely defined and over-etching of the BOX layer 11 is avoided. For this alternative, the strained semiconductor layer 12 in which the semiconductor blocks 12c are formed rests on an insulating layer 111. The insulating layer 111 is itself arranged on and in contact with the etch-stop layer 110. The insulating layer 111 is preferably based on a material such as, for example, $SiO_2$, capable of being etched in a selective manner in relation to the material of the etch stop layer. The selective etch is for example carried out using HF when the insulating layer 111 is made of $SiO_2$ and the stop layer made of SiN.

An example of a method for making a stack comprising such an etch-stop layer is to form a layer of SiN on one of the oxide layers of a first substrate comprising a Si/oxide stack or a second substrate comprising a Si/oxide stack, then transferring the first substrate onto the second substrate so as to arrange the layer of SiN between the two oxide layers.

A method according to the invention as described above can be implemented on a semiconductor layer which does not necessarily have an initial strain, but which is then placed under strain, for example by forming source and drain blocks based on semiconductor that has a different lattice parameter from that of the semiconductor layer in which the channel structure is envisaged. Once this strain has been applied, the cavity is made and then sectioning of the semiconductor layer into blocks is performed.

An alternative to one or the other of the examples of the methods described above envisages starting from a different structure with a silicon-based "surface" semiconductor layer 12, this time formed for example by epitaxy, on and in contact this time with a layer 211 made of $Si_{1-z}Ge_z$.

Then steps described in one or other of the examples of methods described above is carried out. Thus a sacrificial gate block is formed on the semiconductor layer 12, and source and drain semiconductor blocks 18, 19 are formed on either side of this sacrificial gate block. The semiconductor blocks 18, 19 are preferably made of $Si_{1-x}Ge_x$ (where $0<x\leq 1$, where x is typically between 20% and 50%) in order to strain, or further strain, the surface semiconductor layer 12 made of silicon.

Figure 8A:
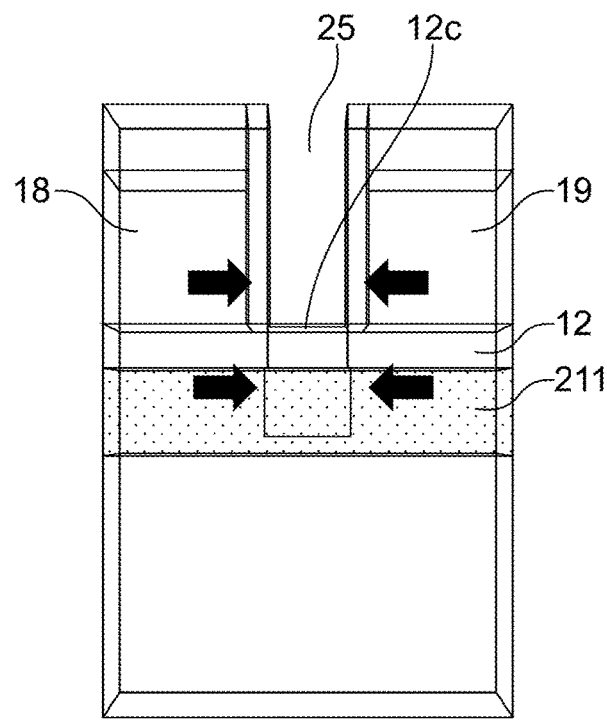
FIGS. 8A-8B show an alternative embodiment for which the strained semiconductor layer is made of Si or SiGe and formed on a layer made of SiGe with a greater concentration of Germanium.
Figure 8B:
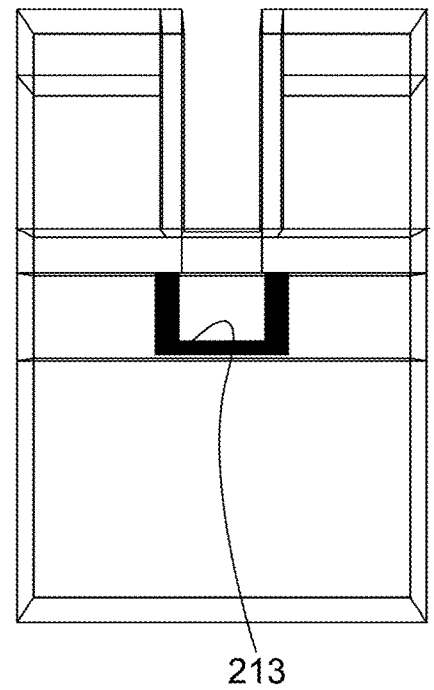

The sacrificial gate block is then removed so as to form a cavity 25, where this cavity reveals a region of the strained semiconductor layer 12 wherein the transistor channel is envisaged. Then at least a suspended semiconductor block 12c is defined in cavity 25 by etching (FIG. 8A). Due to the presence of the material with a lattice parameter which is this time different on and also beneath the silicon surface layer 12, then during release of the suspended semiconductor block 12c an increased strain is achieved in the latter.

Before forming a gate in the cavity 25 and around the suspended semiconductor block 12c, a remaining portion of the layer 211 made of $Si_{1-z}Ge_z$ revealed in the cavity is insulated, in order to prevent contact between the gate and this remaining portion. Insulation is advantageously achieved by oxidation of the layer 211 made of $Si_{1-z}Ge_z$, and more particularly selective oxidation in relation to the silicon of the semiconductor block 12c insofar as the oxidises more rapidly than the silicon. At a given oxidation temperature, the oxidation selectivity depends on the Germanium concentration. The graph in FIG. 13 of document "Needs of low Thermal Budget Processing in SiGe Technology", by König et al, Solid State Phenomena, 1996 shows, for example, that in a given temperature range, increasing the Germanium concentration can increase the oxidation selectivity relative to silicon. Those skilled in the art may thus alter the Germanium concentration in layer 211 as a function of the desired selectivity. A Germanium concentration z greater than 20% is preferably chosen, of the order, for example, of 50%.

An oxidation temperature is also preferably chosen that is below 900° C. in order to limit unwanted diffusion effects of dopants into the semiconductor block 12c. In the case where a thin oxide layer is formed on the semiconductor bar 12c, this may be removed whereas a thickness of an oxidised zone 213 of the layer 211 made of $Si_{1-z}Ge_z$ is retained. Alternatively, a thin thickness of oxide, for example between 2 and 6 nm is retained on the semiconductor block 12c before the gate is formed.

The method example which has just been described is in particular suited to the manufacture of a pMOS type transistor. According to another embodiment possibility for the method which has just been described, the starting point is a silicon germanium surface semiconductor layer 12 resting on a layer 211 made of $Si_{1-z}Ge_z$ with a Germanium concentration greater than that of the surface layer 12. The concentration difference is preferably greater than 20% in order to obtain a greater strain and to subsequently be able to perform selective oxidation of revealed portions of the layer 211 relative to the semiconductor bar 12c.

The invention claimed is:

1. A method for making a device comprising at least a strained semiconductor structure configured to form at least a transistor channel, the method comprising:
   a) forming, on a semiconductor layer, a sacrificial gate block and source and drain blocks on either side of the sacrificial gate block, said semiconductor layer being a strained surface semiconductor layer disposed on an underlying insulating layer, with the underlying insulating layer being disposed on a separately formed etch-stop layer;
   b) removing the sacrificial gate block to form a cavity, the cavity revealing a region of said strained surface semiconductor layer configured to form the transistor channel; and
   c) etching, in the cavity, one or more portions of the region to define one or more semiconductor blocks and holes on either side, respectively, of said one or more semiconductor blocks,
   wherein the etching of holes is extended into the underlying insulating layer to form one or more galleries in the underlying insulating layer, etching of the galleries being stopped by said etch-stop layer.

2. The method according to claim 1,
   wherein the strained surface semiconductor layer is a surface semiconductor layer of a semiconductor-on-insulator type substrate, and
   wherein the surface semiconductor layer is arranged on and in contact with an underlying insulating layer.

3. The method according to claim 2, wherein the surface semiconductor layer is a strained semiconductor layer which has an intrinsic strain prior to the formation of source and drain blocks at step a).

4. The method according to claim 1, wherein the transistor is of the fully depleted silicon-on-insulator (FDSOI) type.

5. The method according to claim 1, wherein the strained surface semiconductor layer is a surface semiconductor layer made of $Si_{1-a}Ge_a$ (where $a\geq 0$) disposed on an underlying layer made of $Si_{1-z}Ge_z$ (where $z>a$).

6. The method according to claim 1,
   wherein the strained surface semiconductor layer is a surface semiconductor layer disposed on an underlying layer, wherein the one or more galleries extend, respectively, beneath the one or more semiconductor blocks, such that the one or more semiconductor blocks are suspended above said galleries.

7. The method according to claim 1,
wherein the strained surface semiconductor layer is a surface semiconductor layer made of $Si_{1-a}Ge_a$ (where a≥0) disposed on an underlying layer made of $Si_{1-z}Ge_z$ (where z>a), and
wherein the etching of holes is extended into the underlying layer to form the one or more galleries, respectively, beneath the one or more semiconductor blocks,
the method further comprising, after step c) and before a gate formation step: selectively oxidizing a portion of the underlying layer made of $Si_{1-z}Ge_z$ relative to the surface semiconductor layer made of $Si_{1-a}Ge_a$.

8. The method according to claim 1, wherein the etching at step c) is carried out through at least an opening in an etching mask comprising one or more rectangular shaped patterns.

9. The method according to claim 1, wherein the etching at step c) is carried out such that the one or more semiconductor blocks defined at step c) possess lateral faces exhibiting a curvature.

10. The method according to claim 9, wherein the etching at step c) is carried out through at least an opening in an etching mask comprising one or more circular or ovoid-shaped patterns.

11. The method according to claim 8, wherein the etching mask comprises patterns made of block polymers.

12. The method according to claim 8, further comprising, after step c), forming a gate in said opening.

13. The method according to claim 1, wherein the source and drain blocks are made from a semiconductor material having a lattice parameter, which is different from that of the semiconductor layer on which the blocks are formed at step a).

14. The method according to claim 10, wherein the etching mask comprises patterns made of block polymers.

15. The method according to claim 10, further comprising, after step c), forming a gate in said opening.

16. The method according to claim 1, wherein the underlying insulating layer is a silicon oxide layer, the etch-stop layer being a silicon nitride layer.

17. A method for making a device comprising at least a strained semiconductor structure configured to form at least a transistor channel, the method comprising:
a) forming, on a semiconductor layer, a sacrificial gate block and source and drain blocks on either side of the sacrificial gate block, said semiconductor layer being a strained surface semiconductor layer disposed on an underlying insulating layer;
b) removing the sacrificial gate block so as to form a cavity, the cavity revealing a region of said strained surface semiconductor layer configured to form the transistor channel;
c) etching, in the cavity, one or more portions of the region to define one or more semiconductor blocks and holes on either side, respectively, of said one or more semiconductor blocks,
wherein said strained surface semiconductor layer is a surface semiconductor layer made of $Si_{1-a}Ge_a$ (where a≥0) disposed on an underlying layer made of $Si_{1-z}Ge_z$ (where z>a), and
wherein the etching of holes is extended into the underlying layer to form one or more galleries, respectively, beneath the one or more semiconductor blocks; and
d) after step c) and before a gate formation step, selectively oxidizing a portion of the underlying layer made of $Si_{1-z}Ge_z$ relative to the surface semiconductor layer made of $Si_{1-a}Ge_a$.

* * * * *